United States Patent [19]
Nabiev et al.

[11] Patent Number: 5,812,580
[45] Date of Patent: Sep. 22, 1998

[54] LASER DIODE FACET COATING

[75] Inventors: Rashit F. Nabiev, Mountain View; Ian Edmond, Meadow Vista; Michael Jansen; Fang Fang, both of Torrance, all of Calif.

[73] Assignee: Coherent, Inc., Santa Clara, Calif.

[21] Appl. No.: 743,309

[22] Filed: Nov. 5, 1996

[51] Int. Cl.[6] ................................. H01S 3/19; H01S 3/08
[52] U.S. Cl. ................................................ 372/49; 372/99
[58] Field of Search ........................................ 372/49, 99

[56] References Cited

U.S. PATENT DOCUMENTS

| 4,852,112 | 7/1989 | Kagawa et al. | 372/49 |
| 4,975,922 | 12/1990 | Sakane et al. | 372/49 |
| 5,339,326 | 8/1994 | Tsujimura et al. | 372/49 |

FOREIGN PATENT DOCUMENTS

| 3-259585 | 11/1991 | Japan | 372/49 |
| 1407351 | 2/1973 | United Kingdom | H01S 3/08 |

OTHER PUBLICATIONS

Brian E. Newnam et al., "Multiple–Shot Ultraviolet Laser Damage Resistance of Nonquarterwave Reflector Designs for 248 nm", Optical Coating Laboratory, Inc., Santa Rosa, CA (1982), pp. 363–370. (no month available).

Trudy Tuttle Hart et al., "Effects of Undercoats and Overcoats on Damage Thresholds of 248 nm Coatings", Lawrence Livermore National Laboratory, University of California, Livermore, CA, (1983), pp. 344–349. (no month available).

Technical Optics Ltd., (catalog —1988), two pages.

S.N. Stolyarov., "Influence of Interference Coatings on the Optical Strength of Semiconductor Laser Mirrors", Soviet Journal of Quantum Electronics, Published by American Institute of Physics, vol. 15, No. 8, Aug. 1988, pp. 1021–1025.

P.G. Eliseev., "Optical Strength of Semiconductor Laser Materials", Center for High Technology Materials, Prog. Quant. Electr, Published by Elsevier Science Ltd., Great Britain, 1996, vol. 20, No. 1, pp. 1–82. (no month available).

*Primary Examiner*—Rodney B. Bovernick
*Assistant Examiner*—Quyen Phan Leung
*Attorney, Agent, or Firm*—Limbach & Limbach L.L.P.

[57] ABSTRACT

A multi-layer high reflective dielectric optical coating deposited on a laser diode facet that shifts the high amplitude peak of the electric field associated with the reflection of light away from the interface between the semiconductor material and the reflective coating, and into the reflective coating itself. By shifting the electric field peak in this manner, the laser diode can operate at much higher optical output powers without inducing catastrophic optical damage at the non-output facet.

6 Claims, 4 Drawing Sheets

LASER DIODE FACET COATING

FIELD OF THE INVENTION

The present invention relates to semiconductor lasers, and more particularly to the optical coatings deposited on semiconductor lasers.

BACKGROUND OF THE INVENTION

A semiconductor laser (laser diode) transforms electrical energy into optical energy with relatively high efficiency. A laser diode is typically formed of a layer of P-type semiconductor material, a layer of N-type semiconductor material, and a low loss optical waveguide layer (the active layer) sandwiched therebetween. When electrical current passes from the P-type layer to the N-type layer, stimulated emission of optical radiation results in the active layer. In practice, the stimulated emission is limited to only a portion (the active region) of the active layer. The opposing end faces of the active region are called the facets, which are cleaved and/or etched to define a laser cavity therebetween. A highly reflective dielectric coating is usually deposited on one facet (the non-output facet), and a semi-reflective dielectric coating on the other facet (the output coupling facet). The optical energy generated by the electric current oscillates between the output facet and the non-output facet, and is partially transmitted by the semi-reflective coating at the output facet to produce a diode laser output beam.

Facet degradation is a serious problem in laser diodes. Specifically, a key failure mode of laser diodes is catastrophic optical damage (COD), which occurs suddenly as a result of destructive melting of the semiconductor material at the facets due to excessive absorption of the optical power oscillating in the active region. Excessive absorption occurs when the oscillating optical power in the active region exceeds a critical level, which causes the electrons in the conduction band to recombine with holes in the valence band of the semiconductor to generate heat instead of light. The generated heat narrows the bandgap between the conduction band and the valence band, which causes absorption, and therefore more heat is generated, thus resulting in an avalanche effect which destroys the semiconductor material that forms the active region.

Excessive optical energy absorption is acute at the non-output facet due to surface conditions and states at this facet surface that make it especially vulnerable to optically induced damage caused by excessive heat generation. For example, an increase of the localized high optical energy density at the non-output facet surface due to light reflected by the reflective coating induces excessive absorption which leads to COD. In particular, high electric field intensities associated with the reflection of light are located at this vulnerable facet surface. Excessive absorption is also caused by oxidation of the semiconductor material at the facets through a photo-assisted reaction. This effect is enhanced in active regions that contain aluminum which results in increased facet oxidation. Therefore, because the non-output facet surface is especially vulnerable to COD, the maximum output power of a laser diode is limited by the maximum tolerable optical power density that can oscillate at the non-output facet without causing COD.

There have been several attempts to increase the COD threshold at the non-output facet to enable laser diodes to operate at higher output powers. For example, facet coatings have been deposited on the facet immediately after the facet is cleaved and/or etched. The coating seals the facet surface to minimize oxidation. Further, vacuum cleaving has been used to minimize facet oxidation. Chemical passivation using sulfites, or metal gettering agents, have been used to minimize the effects of COD. These methods are complex and often difficult to implement, and have enjoyed only a limited success for most laser diode structures in significantly preventing the onset of COD. There is a need for a laser diode design that is simple to implement and significantly increases the COD threshold at the non-output facet, thereby allowing laser diodes to safely operate at much higher optical powers without damaging the diode's active region at the non-output facet.

SUMMARY OF THE INVENTION

The aforementioned problems of COD at the non-output facet have been solved by an improved high reflective dielectric coating for the non-output facet. The present inventors have discovered that conventional non-output facet reflective coatings induce a high amplitude electric field peak that is located at the interface between the semiconductor material and the optical coating. It is this high amplitude peak that causes the COD failures at the non-output facet. However, by shifting the electric field peak away from the non-output facet surface and into the reflective coating itself, operating powers can be dramatically increased without inducing COD, because the dielectric coating is far more tolerant of the high electric field peak than the semiconductor material at this interface.

The optical coating of the present invention is applied to a laser diode having a layer of optically active material disposed between a p-type layer and an n-type layer. The active material layer has two opposing ends that define a laser cavity therebetween. When electrical current passes between the p-type layer and the n-type layer, optical radiation oscillates in a standing wave fashion between the two opposing ends. A dielectric reflective coating having a plurality of layers is formed on at least one of the two opposing ends. The material and thickness of each of the plurality of layers are selected to reflect the optical radiation such that a maximum amplitude electric field peak of the optical radiation associated with the reflection is located inside the dielectric coating and spaced from the one end.

Other objects and features of the present invention will become apparent by a review of the specification, claims and appended figures.

DETAILED DESCRIPTION OF THE PREFERRED EMBODIMENTS

The present invention is a multi-layer high reflective dielectric optical coating deposited on a laser diode facet that shifts the high amplitude peak of the electric field associated with the reflection of light away from the interface between the semiconductor material and the reflective coating, and into the reflective coating itself. By shifting the electric field peak in this manner, the laser diode can operate at much higher optical output powers without inducing catastrophic optical damage (COD) at the non-output facet.

Figure 1:
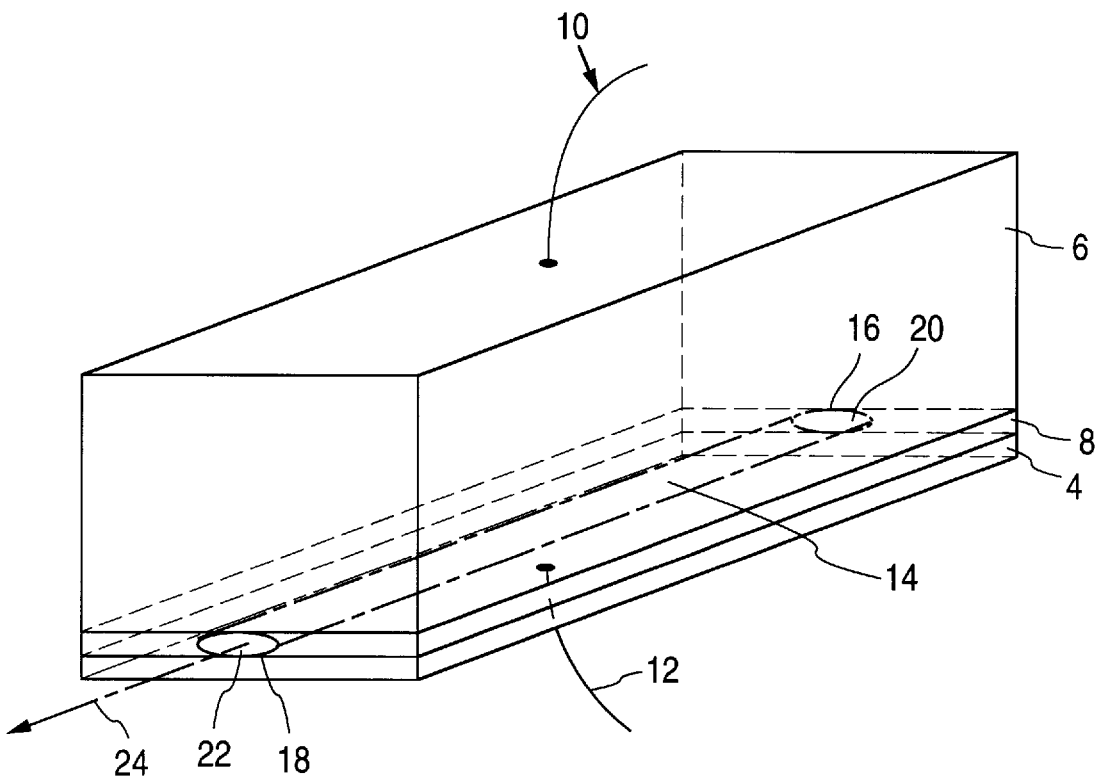
FIG. 1 is a perspective view of a laser diode with the reflective coating of the present invention.

The laser diode 2 incorporating the high reflective dielectric coating of the present invention is illustrated in FIG. 1, and includes a layer of P-type semiconductor material 4, a layer of N-type semiconductor material 6, and an optically active layer 8 sandwiched therebetween. When electrical current is applied to the laser diode by electrical leads 10 and 12, stimulated emission of optical radiation results in an active region 14 of the active layer 8. The active region 14 terminates in cleaved and/or etched facets, with a non-output facet 16 at one end and an output facet 18 at the other end. These facets define a laser cavity therebetween.

To produce a single, high power output beam, a high reflective coating 20 is deposited onto non-output facet 16, and a semi-reflective coating 22 is deposited onto output facet 18. The optical radiation oscillates in a standing-wave fashion between the two facets 16/18, whereby part of the oscillating radiation is transmitted out of the laser cavity through the semi-reflective coating 22 on output facet 18 to create a diode laser output beam 24.

Figure 2:
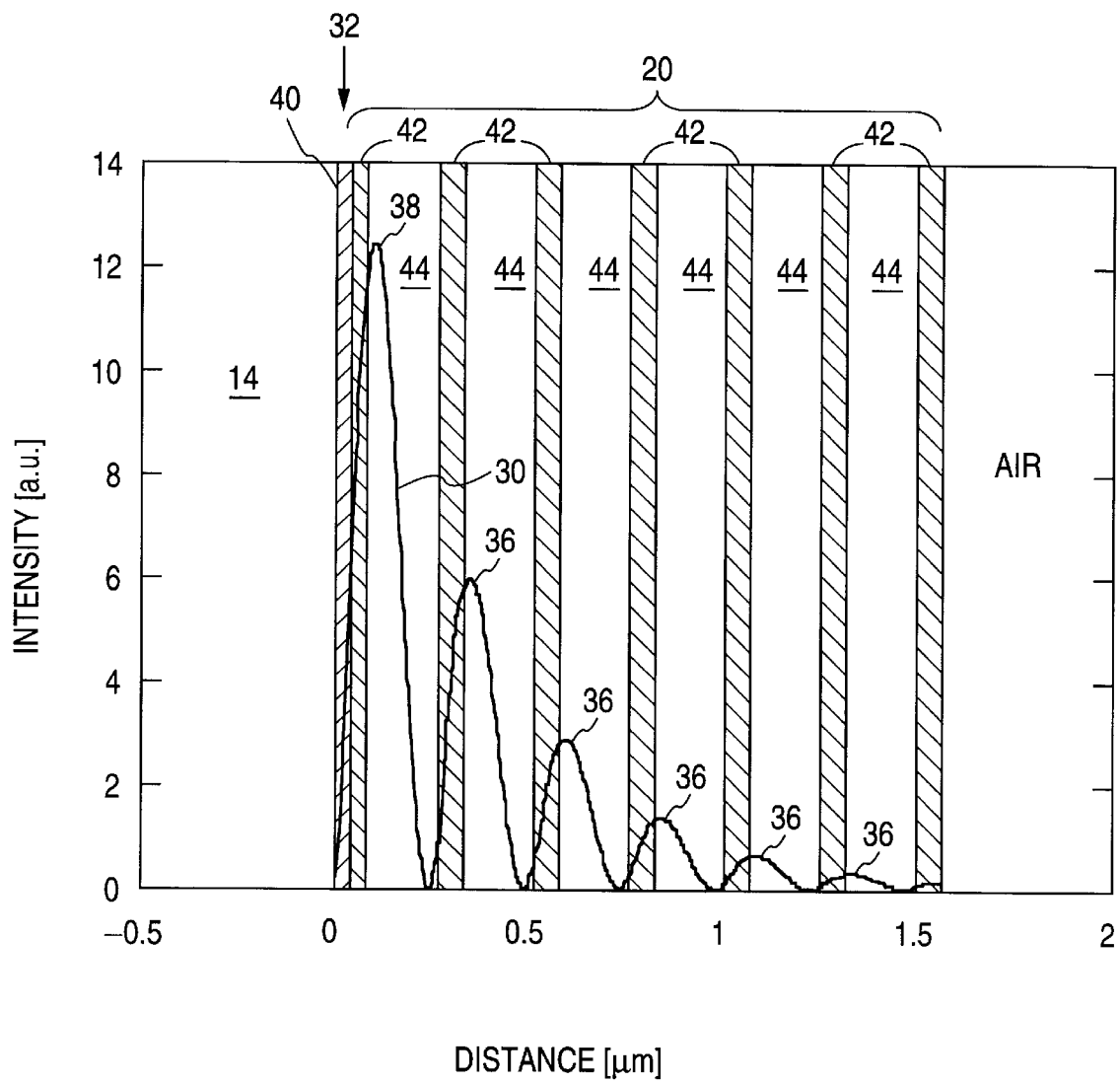
FIG. 2 is a side view diagram of the reflective coating and an overlapping graph of the standing wave electric field adjacent the coating/facet interface.

The high reflective coating 20 of the present invention is illustrated in FIG. 2, along with an overlapping plot of the standing wave electric field 30 of the optical radiation oscillating adjacent the facet/coating interface 32. The high reflective coating 20 is a multi-layer dielectric coating that reflects light incident on the facet/coating interface 32 back into the active region 14 via a plurality of coating layers 42/44 stacked on top of each other. The different layer materials and thicknesses are selected so that at least a portion of the light incident on each of the layer boundaries is constructively reflected back onto itself toward the non-output facet 16.

During operation, the optical energy oscillates between the facets 16/18 in a standing wave fashion. By reflecting light at the output facet surface using a reflective optical coating, a single maximum amplitude electric field peak 38 is generated adjacent the facet/coating interface 32, with a series of electric field peaks 36 that decrease in amplitude inside the coating 20.

With conventional high reflective coatings used on laser diodes, the maximum amplitude peak 38 is located at the interface 32. This high amplitude electric field peak 38 breaks down conventionally coated semiconductor facet materials adjacent interface 32 because this interface is vulnerable to COD.

The layer thicknesses and materials in the high reflective coating 20 of the present invention, however, are selected to shift the maximum amplitude peak 38 so that it is positioned within the dielectric coating 20 instead of at the interface 32. In effect, the reflection process, and its associated electric field peaks, is delayed until after the light has penetrated into the coating 20. The dielectric coating 20 has a much higher damage threshold with respect to the high electric field peak 38 than does the semiconductor material, especially if the semiconductor material contains any oxidation. With peak 38 located inside the coating 20, higher optical powers can safely oscillate in the active region 14 without inducing COD at interface 32, thus resulting in higher maximum output powers. In fact, experimental results indicate that a laser diode with the high reflective coating 20 of present invention formed on the non-output facet 16 can safely operate at more than twice the output power compared to diodes operating with conventional high reflectance coatings.

Coating 22 on the output facet 18 can be non-reflective for some laser diode designs. For such a laser diode design, coating 22 serves to protect the output facet 18 from oxidation, but not reflect light. Typical laser diode designs, however, use an output facet coating 22 that is partially reflective to enhance efficiency. As the reflectivity of coating 22 increases, the higher the electric field peak becomes at the interface between the output facet 18 and the optical coating 22. Therefore, to prevent COD to the output facet 18, the electric field shifting coating of the present invention can also be incorporated in the coating 22 to shift the electric field peak away from output facet 18 and into coating 22.

The high reflective coating 20 illustrated in FIG. 2 is specifically designed for an aluminum gallium arsenide diode laser, which outputs optical energy having a wavelength of about 808 nm. The coating 20 is a 14 layer stack coating with a first layer 40 of aluminum oxide ($Al_2O_3$) followed by alternating layers 42 of titanium dioxide ($TiO_2$) and layers 44 of silicon dioxide ($SiO_2$). The aluminum oxide is a bonding layer, which getters oxygen from the gallium arsenide substrate. As illustrated by FIG. 2, the high electric field peak 38 is positioned in the third layer (44) in coating 20.

The thicknesses of the different layers are best described in terms of QWOT (quarter wavelength optical thickness), which is defined as:

$$QWOT = \frac{\text{laser output wavelength}}{4} = nd$$

where n is the refractive index of the layer material for that wavelength, and d is the physical thickness of the layer. The formula for the coating 20 illustrated in FIG. 2 is, starting from the first layer deposited on the diode facet:

0.25M, 0.5H, 1.36L, 0.62H, 1.36L, 0.62H, 1.36L, 0.62H, 1.36L, 0.62H, 1.36L, 0.62H, 1.36L, 0.62H;

where H is a material with a relatively high refractive index, M is a material with a relatively medium refractive index, and L is a material with a relatively low refractive index, such that the refractive index of the facet substrate is larger than the refractive index of the H material, which is larger than the refractive index of the M material, which is larger than the refractive index of the L material, which is larger than the refractive index of air.

The layer materials for the coating 20 illustrated in FIG. 2 are:

H=titanium dioxide (or Hafnium Dioxide or Zirconium Dioxide or Scandium Oxide or Tantalum Pentoxide)

M=aluminum oxide, and

L silicon dioxide.

Therefore, 0.25M=quarter of a QWOT of aluminum oxide, 0.5H=half of a QWOT of titanium dioxide (or Hafnium Dioxide or Zirconium Dioxide or Scandium Oxide or Tantalum Pentoxide), 1.36L=1.36 times a QWOT of silicon dioxide, and so on. This formula can be represented in a shorter format as:

0.25M, 0.5H, (1.36L, 0.62H)$^6$;

where "(1.36L, 0.62H)$^6$" means 6 sets of alternating coatings of 1.36 QWOT of silicon dioxide and 0.62 QWOT of titanium dioxide (or Hafnium Dioxide or Zirconium Dioxide or Scandium Oxide or Tantalum Pentoxide). As illustrated in FIG. 2, optical coating 20 is ideal because not only is the maximum peak 38 shifted away from interface 32, but in fact the electric field intensity 30 has a minimum near the interface 32, which minimizes heat generation, and therefore the likelihood of COD, at this vulnerable portion of the semiconductor material.

It should be noted that additional layers of (1.36L, 0.62H) can be added or removed to/from the coating 20 of FIG. 2 and still achieve the electric field peak shifting effect of the present invention. Therefore, a more generic formula for an electric field shifting coating of FIG. 2 is:

$$0.25M, 0.5H, (1.36L, 0.62H)^I,$$

where I is any integer.

Figure 3:
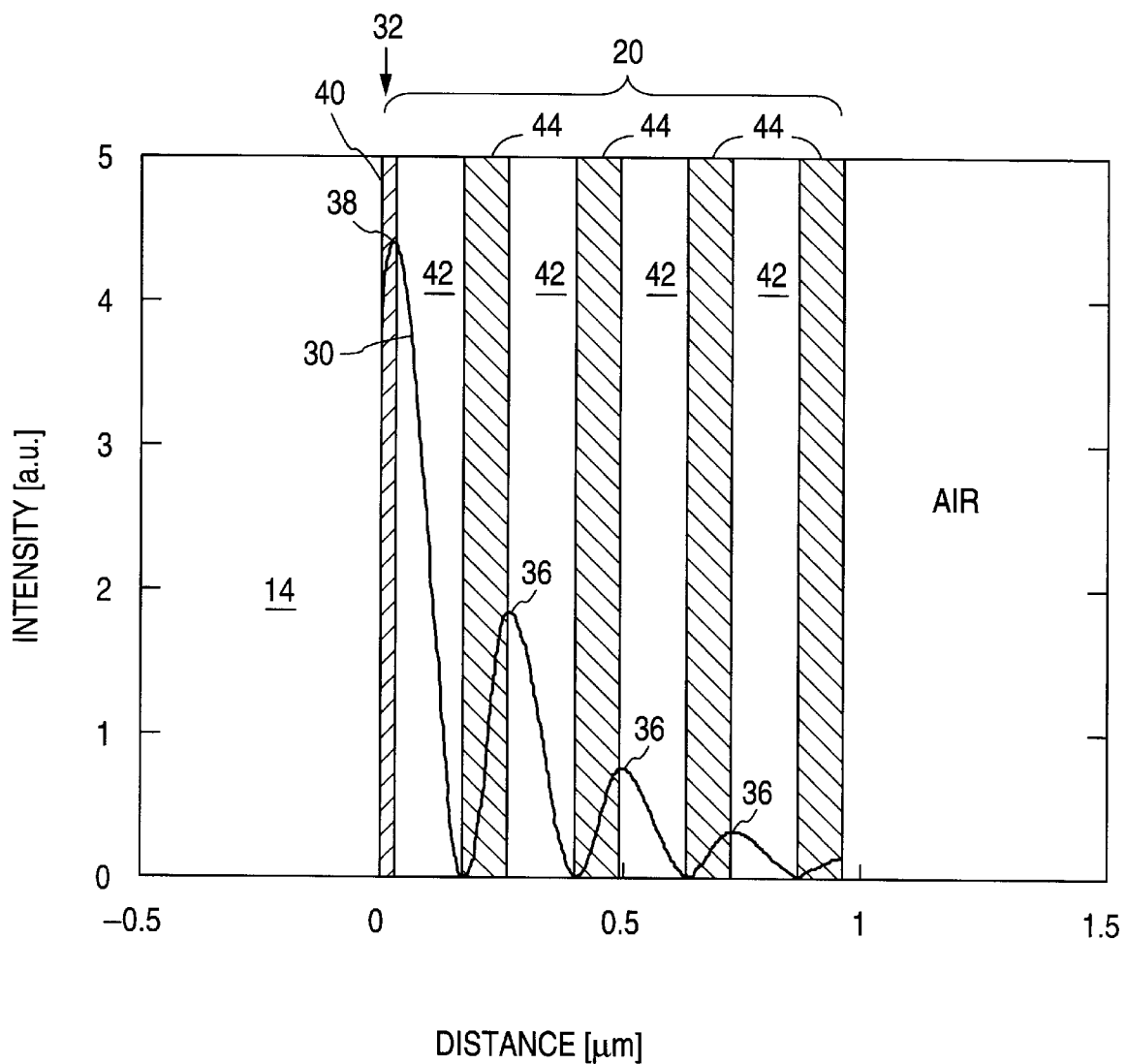
FIG. 3 is a side view diagram of an alternate embodiment of the reflective coating and an overlapping graph of the standing wave electric field adjacent the coating/facet interface.

FIG. 3 illustrates an alternate high reflective coating design that also shifts the peak 38 into coating 20. This coating causes the peak 38 to be located in the first layer 40, near the boundary between the first and second layers (40/42) within coating 20. The coating materials and layer thicknesses of this alternate design are:

$$(0.25)M, (L,H)^4.$$

Since additional layers of (LH) could be added or removed from the coating formula above and still achieve the electric field peak shifting of the present invention, the generic coating formula for this coating design is:

$$(0.25)M, (L,H)^I.$$

Figure 4:
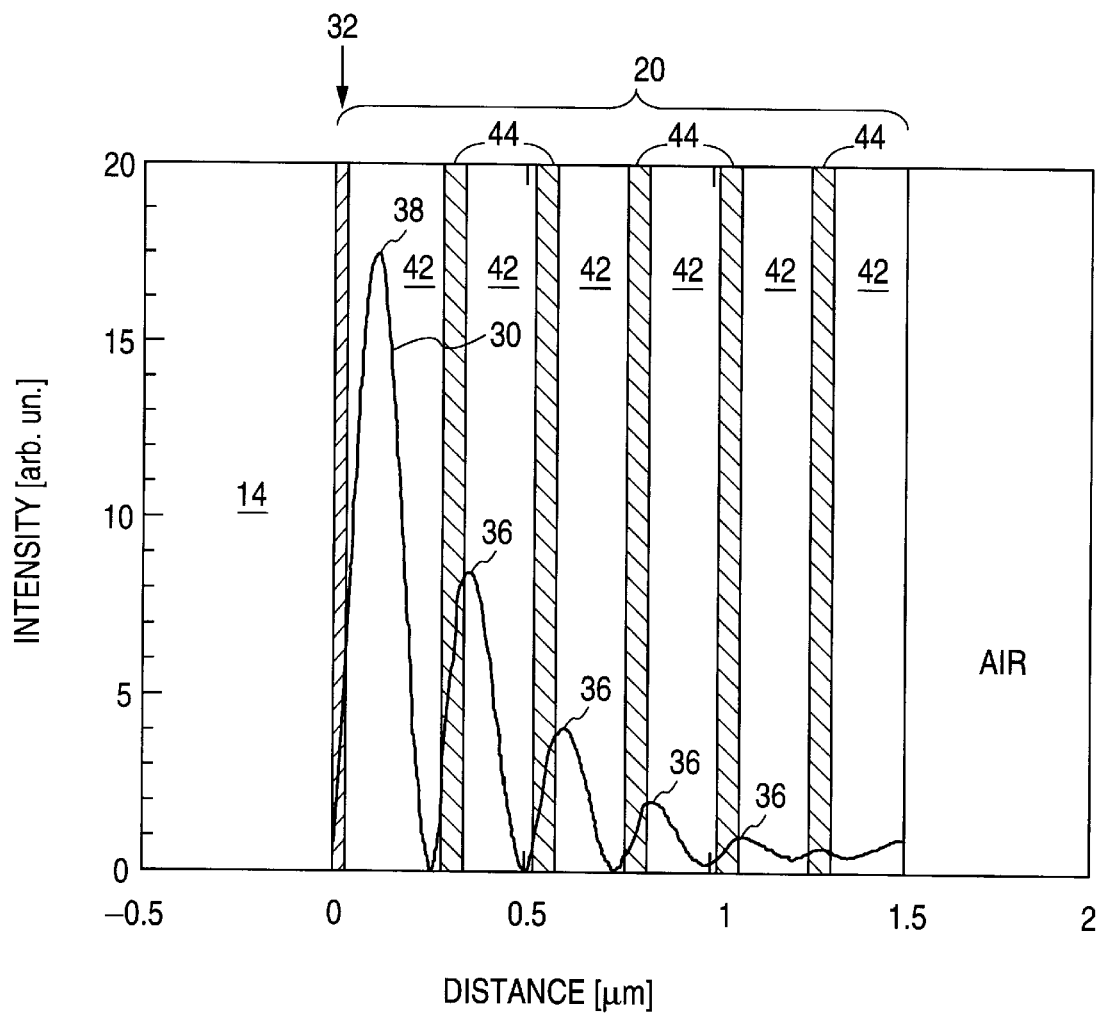
FIG. 4 is a side view diagram of a second alternate embodiment of the reflective coating and an overlapping graph of the standing wave electric field adjacent the coating/facet interface.

FIG. 4 illustrates a second alternate high reflective coating design that also shifts the peak 38 into coating 20. This coating causes the peak 38 to be located in the second layer 42 of coating 20. The coating materials and layer thicknesses of this second alternate design are:

$$0.25M, 1.86L, (0.62H, 1.36L)^5,$$

Since additional layers could be added or removed from the coating formula above and still achieve the electric field peak shifting of the present invention, the generic coating formula for this coating design is:

$$0.25M, 1.86L, (0.62H, 1.36L)^I$$

Other examples of coating formulas that have been designed by the present inventors that produce the electric field shift effect of the present invention are:

$$0.25M, (0.73L, 0.73H)^I, (1.1L, 1.1H)^I,$$

$$(H,L)^I,$$

$$(H,M)^I,$$

$$2.0M, (H,M)^I, \text{ and}$$

$$2.0L, (H,L)^I,$$

where

M=aluminum oxide,

H=titanium dioxide (or Hafnium Dioxide or Zirconium Dioxide or Scandium Oxide or Tantalum Pentoxide), and L=silicon dioxide. All of these coatings efficiently reflect light while inducing the high amplitude electric field adjacent the interface 32 to shift into the reflective coating itself.

While any shift of the electric field peak 38 away from interface 32 results in improved performance (as shown in FIG. 3), significant increases in the laser diode maximum output power are achieved by an electric field peak shift of one quarter of the standing-wave wavelength (one eighth of the output wavelength) in the coating, which results in a 50% decrease in the amplitude of the electric field at the interface 32. To maximize laser diode performance, the coating 20 shifts the electric field peak by half of the standing wave wavelength (one quarter of the output wavelength), which minimizes the electric field amplitude at the interface 32.

It is to be understood that the present invention is not limited to the embodiments described above and illustrated herein, but encompasses any and all variations falling within the scope of the appended claims.

What is claimed is:

1. A laser diode for transforming electrical current into optical energy comprising:

a layer of p-type semiconductor material;

a layer of n-type semiconductor material;

a layer of optically active material disposed between the p-type layer and the n-type layer, the active material layer having two opposing ends that define a laser cavity therebetween, wherein when the electrical current passes between the p-type layer and the n-type layer, optical radiation oscillates in a standing wave fashion between the two opposing ends; and a dielectric reflective coating having a plurality of layers formed on at least one of the two opposing ends wherein the material and thickness of each of said plurality of layers are selected to reflect the optical radiation and wherein a maximum amplitude electric field peak of the optical radiation associated with said reflection is located inside the dielectric coating and spaced from said one end;

wherein each of said plurality of layers is formed of one of aluminum oxide, titanium dioxide, hafnium dioxide, zirconium dioxide, scandium oxide, tantalum pentoxide and silicon dioxide, and wherein said coating comprises a single layer of aluminum oxide formed on said one end, and a plurality alternating layers of silicon dioxide and one of titanium dioxide, hafnium dioxide, zirconium dioxide, scandium oxide and tantalum pentoxide.

2. A laser diode for transforming electrical current into optical energy, comprising:

a layer of p-type semiconductor material;

a layer of n-type semiconductor material;

a layer of optically active material disposed between the p-type layer and the n-type layer, the active material layer having two opposing ends that define a laser cavity therebetween, wherein when the electrical current passes between the p-type layer and the n-type layer, optical radiation oscillates in a standing wave fashion between the two opposing ends; and a dielectric reflective coating having a plurality of layers formed on at least one of the two opposing ends wherein the material and thickness of each of said plurality of layers are selected to reflect the optical radiation and wherein a maximum amplitude electric field peak of the optical radiation associated with said reflection is located inside the dielectric coating and spaced from said one end;

wherein each of said plurality of layers is formed of one of aluminum oxide, titanium dioxide, hafnium dioxide, zirconium dioxide, scandium oxide, tantalum pentoxide and silicon dioxide, and wherein said coating comprises alternating layers of a first layer selected from the group consisting of titanium dioxide, hafnium dioxide, zirconium dioxide, scandium oxide and tantalum pentoxide, and a second layer of silicon dioxide formed on the first layer.

3. A laser diode forming a laser cavity between opposing ends thereof such that when electrical current passes through said laser diode, optical radiation oscillates in a standing wave fashion between said two ends, wherein the improvement comprises:

a dielectric reflective coating having a plurality of layers formed on at least one of the two opposing ends wherein the material and thickness of each of said plurality of layers are selected to reflect the optical radiation and wherein a maximum amplitude electric field peak of the optical radiation associated with said reflection is located inside the dielectric coating and spaced from said one end;

wherein each of said plurality of layers is formed of one of aluminum oxide, titanium dioxide, hafnium dioxide, zirconium dioxide, scandium oxide, tantalum pentoxide, and silicon dioxide, and wherein said coating comprises a single layer of aluminum oxide formed on said one end, and a plurality alternating layers of silicon dioxide and one of titanium dioxide, hafnium dioxide, zirconium dioxide, scandium oxide and tantalum pentoxide.

4. A laser diode forming a laser cavity between opposing ends thereof such that when electrical current passes through said laser diode, optical radiation oscillates in a standing wave fashion between said two ends, wherein the improvement comprises:

a dielectric reflective coating having a plurality of layers formed on at least one of the two opposing ends wherein the material and thickness of each of said plurality of layers are selected to reflect the optical radiation and wherein a maximum amplitude electric field peak of the optical radiation associated with said reflection is located inside the dielectric coating and spaced from said one end;

wherein each of said plurality of layers is formed of one of aluminum oxide, titanium dioxide, hafnium dioxide, zirconium dioxide, scandium oxide, tantalum pentoxide, and silicon dioxide, and wherein said coating comprises alternating layers of a first layer selected from the group consisting of titanium dioxide, hafnium dioxide, zirconium dioxide, scandium oxide and tantalum pentoxide, and a second layer of silicon dioxide formed on the first layer.

5. A method of shifting a maximum amplitude peak of an electric field for standing wave optical radiation oscillating between two opposing ends of a laser diode, comprising the step of:

depositing a dielectric reflective coating having a plurality of layers formed on at least one of the two opposing ends wherein the material and thickness of each of said plurality of layers are selected to reflect the optical radiation wherein a maximum amplitude electric field peak of the optical radiation associated with said reflection is located inside the dielectric coating and spaced from said one end;

wherein each of said plurality of layers is formed of one of aluminum oxide, titanium dioxide, hafnium dioxide, zirconium dioxide, scandium oxide, tantalum pentoxide and silicon dioxide, and wherein said coating comprises a single layer of aluminum oxide formed on said one end, and a plurality alternating layers of silicon dioxide and one of titanium dioxide, hafnium dioxide, zirconium dioxide, scandium oxide and tantalum pentoxide.

6. A method of shifting a maximum amplitude peak of an electric field for standing wave optical radiation oscillating between two opposing ends of a laser diode, comprising the step of:

depositing a dielectric reflective coating having a plurality of layers formed on at least one of the two opposing ends wherein the material and thickness of each of said plurality of layers are selected to reflect the optical radiation wherein a maximum amplitude electric field peak of the optical radiation associated with said reflection is located inside the dielectric coating and spaced from said one end;

wherein each of said plurality of layers is formed of one of aluminum oxide, titanium dioxide, hafnium dioxide, zirconium dioxide, scandium oxide, tantalum pentoxide and silicon dioxide, and wherein said coating comprises alternating layers of a first layer selected from the group consisting of titanium dioxide, hafnium dioxide, zirconium dioxide, scandium oxide and tantalum pentoxide, and a second layer of silicon dioxide formed on the first layer.

* * * * *